United States Patent [19]
Fujita

[11] Patent Number: 5,978,290
[45] Date of Patent: Nov. 2, 1999

[54] SEMICONDUCTOR MEMORY DEVICE

[75] Inventor: Mamoru Fujita, Tokyo, Japan

[73] Assignee: NEC Corporation, Tokyo, Japan

[21] Appl. No.: 09/119,018

[22] Filed: Jul. 20, 1998

[30]       Foreign Application Priority Data

Aug. 11, 1997 [JP] Japan ................................. 9-216403

[51] Int. Cl.⁶ .................................................. G11C 29/00
[52] U.S. Cl. ............... 365/200; 365/189.07; 365/230.01
[58] Field of Search ............................... 365/200, 189.01, 365/230.01, 201, 189.07

[56]             References Cited

U.S. PATENT DOCUMENTS

| | | | |
|---|---|---|---|
| 5,276,360 | 1/1994 | Fujima | 307/441 |
| 5,381,370 | 1/1995 | Lacey et al. | 365/200 |
| 5,469,390 | 11/1995 | Sasaki et al. | 365/200 |
| 5,568,433 | 10/1996 | Kumar | 365/200 |
| 5,657,280 | 8/1997 | Shin et al. | 365/200 |
| 5,666,314 | 9/1997 | Akaogi et al. | 365/200 |

*Primary Examiner*—Viet Q. Nguyen
*Attorney, Agent, or Firm*—Sughrue, Mion, Zinn, MacPeak & Seas, PLLC

[57]             ABSTRACT

A semiconductor memory device comprising a plurality of memory cell arrays including a redundant memory cell for each. Connection between each memory cell array and data input-output terminals can be switched easily by a signal input from the outside in response to a plurality of input-output data widths. Each redundant memory cell compares each bit of an external address input externally with each bit of an internal address of a memory cell having been stored. According to a detection signal from a redundancy judging circuit to detect agreement between both addresses, the memory cell having that address is replaced. This replacement can be carried out not only within the memory cell array having the redundant memory cell but also between different memory cell arrays.

8 Claims, 10 Drawing Sheets

SEMICONDUCTOR MEMORY DEVICE

BACKGROUND OF THE INVENTION

1. Field of the Invention

The present invention relates to a semiconductor memory device, and more specifically, to means for compensating a defunct memory cell.

2. Description of the Related Art

FIGS. 1 and 2 are circuit diagrams showing configurations of conventional semiconductor memory devices.

Some semiconductor memory devices have plural varieties with different input-output data widths, although they have the same capacity. For example, in 16-Mbit DRAMs, 4M×4-bit, 2M×8-bit, 1M×16-bit types etc., exist. FIGS. 1 and 2 show the cases of DRAMs whose input-output data widths are 4 bit and 8 bit respectively, although they have the same memory cell array structure.

In the DRAM shown in FIG. 1 having the 4-bit configuration, memory cell arrays ARRAY0 and ARRAY1 (hereinafter called ARRAY0 and ARRAY1 respectively) share groups of local IO lines IO00 to IO30 and IO01 to IO31, each of which is composed of 4 lines. Four respective sense amplifiers are connected to each of row decoders YDEC00 to YDECn0 and YDEC01 to YDECn1. These four sense amplifiers are also connected to each of four IO lines IO00 to IO30 and IO01 to IO31 (hereinafter called IO00 to IO31), respectively.

Upon reading and writing data, one of row decoders YDEC00 to YDECn0 and YDEC01 to YDECn1 is selected. Which one of row decoders YDEC00 to YDECn0 and YDEC01 to YDECn1 is selected and activated depends on an address signal input externally. No matter which row decoder is activated, one of data amplifier groups DA00 to DA30 and DA-01 to DA31 (hereinafter called DA00 to DA 31) which is connected to the memory cell array including the activated row decoder (hereinafter called YDEC) is activated while the other is not. In this manner, 4-bit data in total are input and output between ARRAY0 or ARRAY1 whichever including the selected memory cell and input-output terminals DQ1 to DQ4 via global internal input-output lines RWB1 to RWB4 (hereinafter called RWB1 to RWB4).

In the 8-bit configuration DRAM shown in FIG. 2, sense amplifiers of ARRAY0 and ARRAY1 share local IO lines IO00 to IO30 and IO01 to IO31 composed of 4 lines respectively, as in the 4-bit configuration DRAM shown in FIG. 1. Four sense amplifiers are connected to each of YDEC00 to YDECn0 and YDEC01 to YDECn1. These 4 sense amplifiers are respectively connected to each of IO lines IO00 to IO30 and IO01 to IO31.

Upon reading and writing data, one of YDEC00 to YDECn0 and one of YDEC01 to YDECn1 having the same row address are selected. Both groups of DA00 to DA30 and DA01 to DA31 are activated at the same time. In this manner, 4-bit data in total are input and output simultaneously between ARRAY0 and input-output terminals DQ1 to DQ4 (hereinafter called DQ1 to DQ4) and between ARRAY1 and input-output terminals DQ5 to DQB (hereinafter called DQ5 to DQ8). As a result, 8-bit data in total for the entire chip are input and output between DQ1 to DQ8, and ARRAY0, ARRAY1 via global internal input-output lines RWB1 to RWB8 (hereinafter called RWB1 to RWB8).

A general semiconductor memory device has a function to obtain a proper chip by replacing a defunct cell with a redundant cell having been installed therein in advance, even when one of cells becomes defunct. This replacement is carried out by a replacement address comparing circuit. The replacement address comparing circuit compares a row address signal input externally with a replacement address having been stored internally. When the both show an agreement, the replacement is carried out by selecting a row decoder connected to the redundant memory cell corresponding to the row address signal. In FIGS. 1 and 2, redundancy judging circuits YRED0 and YRED1 (hereinafter called YRED0 and YRED1) are the replacement address comparing circuits and redundant cell row decoders RYDEC0 and RYDEC1 (hereinafter called RYDEC0 and RYDEC1) select the redundant cell.

In the 4-bit configuration product shown in FIG. 1, either ARRAY0 or ARRAY1 is activated, and input and output of data is carried out by using either IO00 to IO30 or IO01 to IO31.

For example, in the case where YDEC00 in ARRAY0 is replaced by using RYEDC1 in ARRAY1, YRED0 and YRED1 compare the row address signal input externally with the respective replacement addresses having been stored. In this case, only YRED1 shows an agreement and RYDEC1 is selected and then DA00 to DA30 is stopped from being activated (YDEC00 is not activated at this time), while DA01 to DA31 is activated instead.

In this manner, data which have been input and output between the sense amplifiers connected to YDEC00 and the outside are input and output between redundant sense amplifiers connected to RYDEC1 and the outside, and the replacement has thus been carried out. It is possible for each of RYDEC0 and RYDEC1 in a 4-bit configuration DRAM to replace an ordinary cell in both ARRAY0 and ARRAY1.

Meanwhile, in an 8-bit configuration DRAM shown in FIG. 2, both memory cell arrays ARRAY0 and ARRAY1 are activated simultaneously, and data input and output is carried out by using both IO00 to IO30 and IO01 to IO31 simultaneously. Therefore, it is impossible to replace YDEC01 to YDECn1 in ARRAY1 with RYDEC0 in ARRAY0 and so is vice versa, since data from a plurality of sense amplifiers conflict on IO00 to IO30 or IO01 to IO31. Therefore, the range where RYDEC0 or RYDEC1 can replace the memory cell is limited to the memory cell array containing each.

As has been described above, even in the same memory cell array structure, the range of defunct bit lines that each redundant bit line can replace differs at depending on an input-output data width.

In order to improve efficiency in designing and in production of varieties of semiconductor memory devices meeting a demand, it is generally carried out that plural varieties are implemented by the same die and the varieties are switched from one to another by bonding wires or metal wiring on an upper layer. A third conventional semiconductor device shown in FIG. 3 is an example of a DRAM comprising this switching function therein.

FIG. 4 is an example of a circuit diagram of redundancy judging circuits YRED0 and YRED1 shown in FIG. 3. In FIG. 4, among fuse elements F0N and F0T which can be cut, only a fuse element F0N is cut when the least significant bit of a replacement address to be stored is 0, while only a fuse element F0T is cut when that is 1. Other fuse elements F1N·F1T to F(n−1)N F(n−1)T which can be cut are cut exclusively according to the level of each bit of the replacement address. In other words, by appropriately cutting these fuse elements in advance, a row address of a replacement cell can be stored. Meanwhile, complement signals Y0N and Y0T input externally show the least significant bit of a row address. Other complement signals Y1N·Y1T to Y(n−1)N ·Y(n−1)T are the signals input externally and showing each bit of the row address of each memory cell.

An operation of this circuit will be explained next. Signal RP is normally LOW and becomes HIGH temporarily upon comparison of the replacement address. Therefore, contact 100 is normally HIGH. Upon comparison of the replacement address, if the replacement address having been stored in the fuses and a row address of each memory cell array which is an external address whose most significant bit has been removed are in agreement, contact 100 remains HIGH and becomes LOW if otherwise. As a result, only when the row address input externally agrees with the replacement address, signal YRSEL is output and a corresponding redundant cell becomes activated. Signals YRSEL in FIGS. 1 to 3 have the same suffixes as of memory cell array ARRAY0 or ARRAY1 in which the signals are generated.

FIG. 5 is a circuit diagram showing a configuration of a multiplexer MUX (hereinafter called MUX) installed in the conventional DRAM shown in FIG. 3. In FIG. 5, signal Yn distinguishes ARRAY0 from ARRAY1 in the case of the 4-bit configuration, and here it shows a most significant bit of a row address input externally. The complement signals thereof are shown as YnN and YnT. Being the most significant bit has nothing to do with the nature of the present invention. Signal MDX4 shows a bit configuration, and in the case of 4-bit, it becomes HIGH while Low in 8-bit. Signal MDX4 is configured by a circuit which can select a logic level by using bonding to a pad for example, and this circuit is not explicitly shown in FIG. 5. Furthermore, a signal generating process has nothing to do with the nature of the present invention.

MUX connects RWB1 to RWB8 with DQ1 to DQ8 one to one in the case of an 8-bit configuration, that is, if signal MDX4 is LOW. As a result, an operation which is the same as that by the conventional 8-bit configuration product shown in FIG. 2 can be carried out.

On the other hand, in the case of a 4-bit configuration product, that is, if signal MDX4 is HIGH, MUX connects RWB1 to RWB4 with input-output terminals DQ1 to DQ4 one to one when signal YnT is LOW, that is, when ARRAY0 is being activated. When signal YnT is HIGH, that is, when ARRAY1 is being activated, MUX connects RWB5 to RWB8 with input-output terminals DQ1 to DQ4 one to one.

In this manner, by changing a logic level of signal MDX4, the bit configuration can be changed. Therefore, plural varieties in plural bit configurations can be produced even if the chip design is basically the same.

Locations of defunct cells which occur in a memory cell array are not distributed uniformly, but generally take a biased Poisson distribution. Therefore, even if the total number of redundant cells in a chip is the same, the wider the range of ordinary cells that each redundant cell can replace is, the better the replacement of defunct cells in a biased distribution can be conducted. As a result, a probability of obtaining a proper chip replacing all defunct cells can be improved.

In conventional examples shown in FIGS. 1 and 2, each redundant cell in the 4-bit configuration can replace ordinary cells in an area twice as large as in the 8-bit configuration, and the probability of obtaining a proper chip is thus higher for the 4-bit.

In the conventional example shown in FIG. 3, the array configuration regarding defunct cell replacement is the same in both 4-bit and 8-bit configurations. Therefore, in both cases, only ordinary cells in the same region where the redundant cell exists are selected as in the case of the conventional 8-bit configuration. The probability to obtain a proper chip is thus lower than conventional 4-bit configuration products as shown in FIG.

SUMMARY OF THE INVENTION

Based on consideration of the above problems, an object of the present invention is to provide a semiconductor memory device which improves efficiency of defunct cell compensation means so that a redundant memory cell can be used most efficiently, improves yield, and enables easy switching of input-output data widths, when the semiconductor memory device comprises a plurality of input-output data widths.

A semiconductor memory device of the present invention comprises:

at least two memory cell arrays comprising at least one redundant memory cell for each of the memory cell arrays;

comparison means which compares an external address signal input externally with an internal address, outputs a detection signal showing whether or not the both addresses agree, and activates a corresponding redundant memory cell when the addresses agree;

input-output data width changing means which selects an input-output data width of the memory cell array; and selecting means which activates or inactivates corresponding memory cell array upon selection of the input-output data width by the input-output data width changing means and upon output of the detection signal from the comparison means; wherein the number of digits of the external address signal to be compared by the comparison means is changed when the input-output data width is changed by the input-output data width changing means.

Each memory cell array comprises local data input-output lines between the memory cells and a redundant memory cell therein, and this local data input-output lines are connected selectively to global data input-output lines. The global data input-output lines are connected to data input-output terminals by the input-output data width changing means via a switching means which switches connections between each memory cell array and the data input-output terminals of the semiconductor memory device. The switching means can be inserted between local and global data input-output lines of some of the memory cell arrays.

The input-output data width changing means is realized by changing a state of an internal signal by changing wire bonding in an assembly process or by changing a portion of a wiring layer. Alternatively, the input-output data width changing means may be realized by changing a state of an internal signal by inputting an external signal.

In the case of the semiconductor device of the present invention, by controlling the switching means in conjunction with the selecting means by using the input-output data width changing means (signal MDX4 in FIG. 6), a connection between each memory cell array and a data input-output terminal can be selected appropriately. Furthermore, by using a redundant memory cell in a memory cell array, it is also possible to replace not only a memory cell in the memory cell array but also a memory cell in another memory cell array.

The above and other objects, features, and advantages of the present invention will become apparent from the following description when taken in conjunction with the accompanying drawings which illustrate preferred embodiments of the present invention by way of example.

DESCRIPTION OF THE PREFERRED EMBODIMENTS

[1] First Embodiment

Hereinafter, a first embodiment of a semiconductor memory device of the present invention will be explained with reference to FIGS. 6 to 9. In FIGS. 6 to 9, functions of signals, elements, or the like which are not explained explicitly hereinafter are the same as in the conventional semiconductor memory devices, and explanation of them is omitted here.

Figure 3:
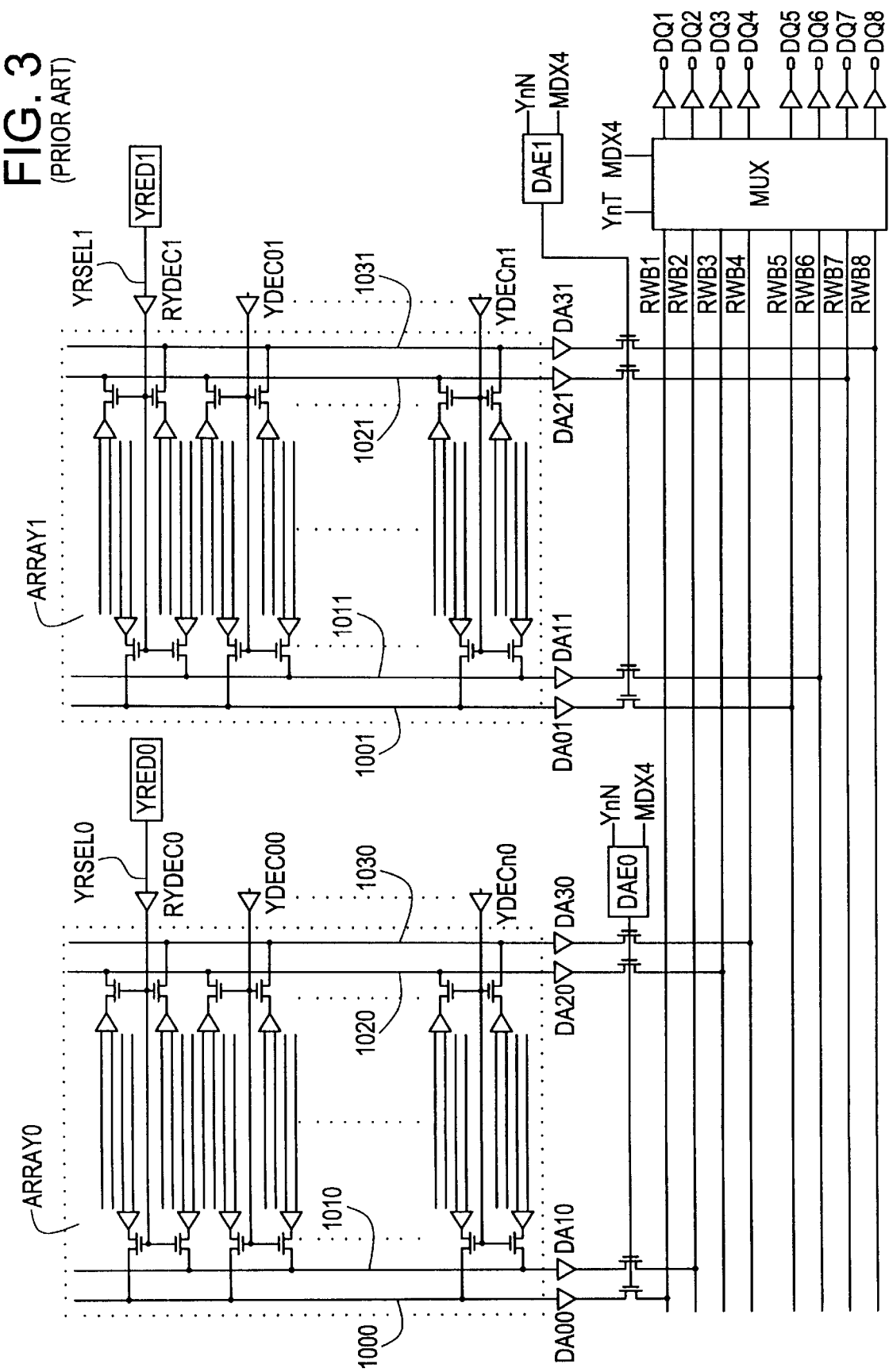
FIG. 3 is a circuit diagram showing a configuration of a third conventional semiconductor memory device.
Figure 4:
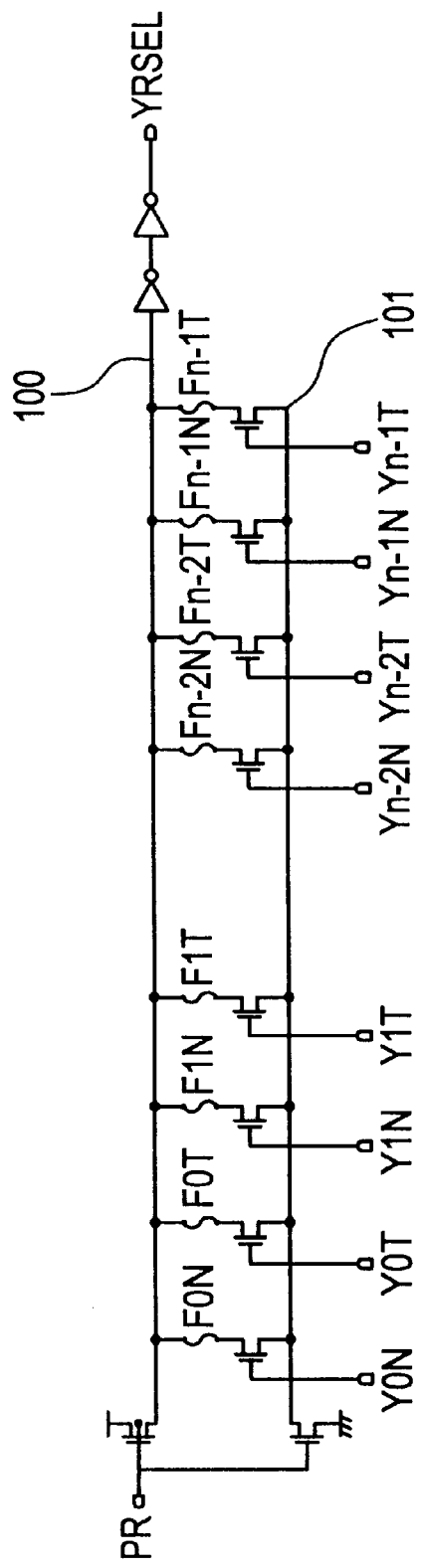
FIG. 4 is a circuit diagram showing a configuration example of a redundancy judging circuit in FIG. 3.
Figure 5:
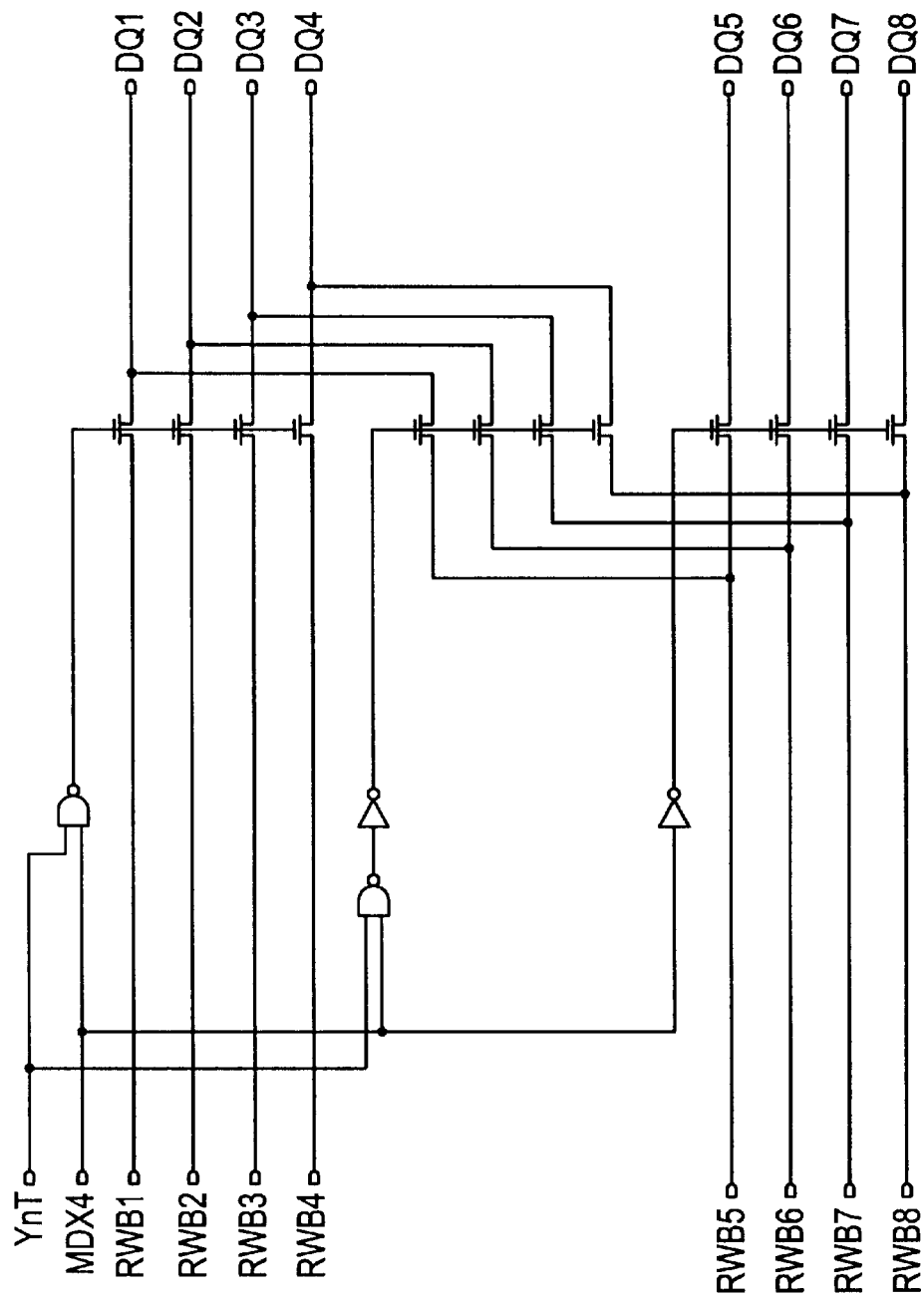
FIG. 5 is a circuit diagram showing a configuration example of a multiplexer in FIG. 3.
Figure 6:
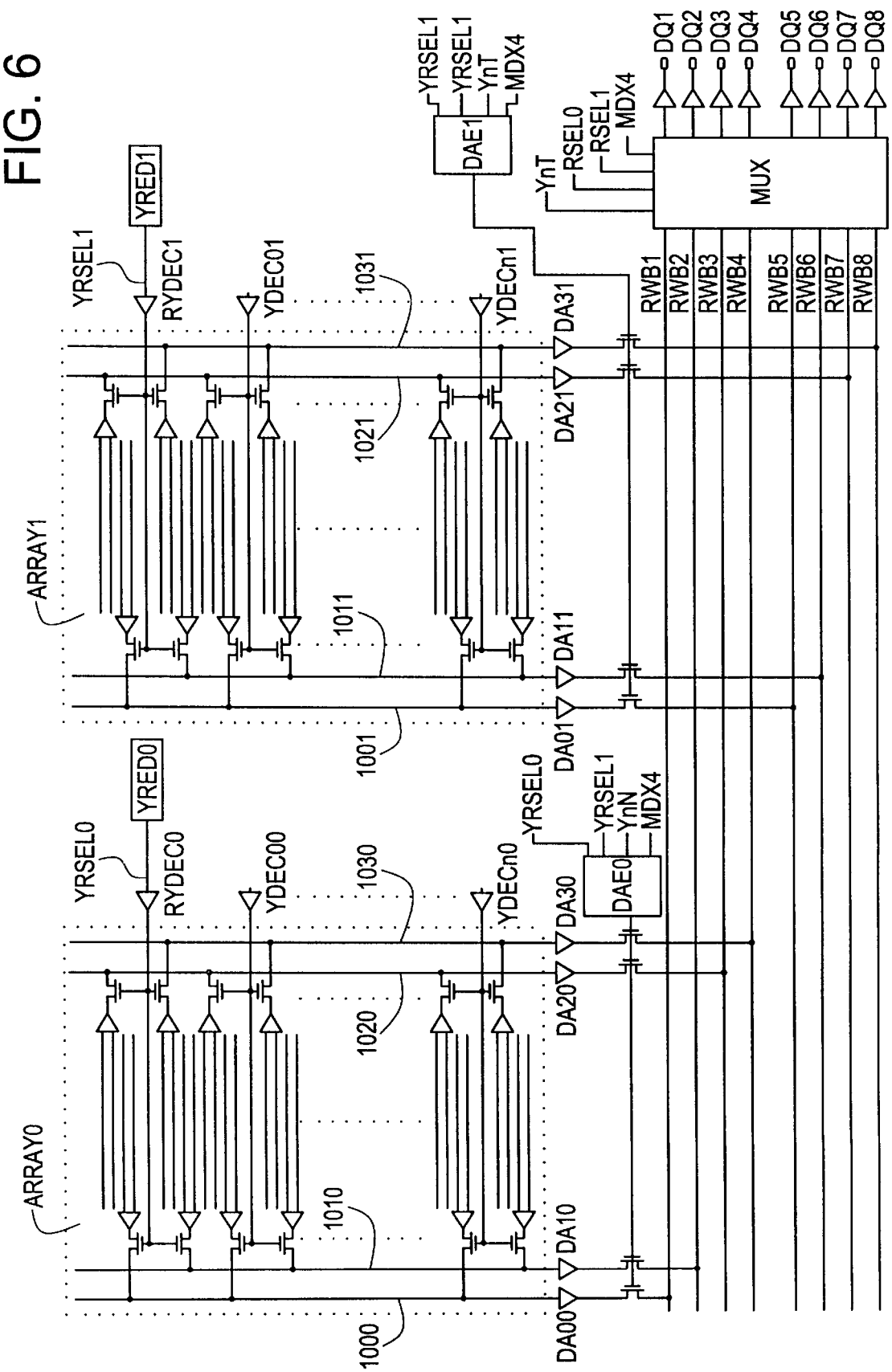
FIG. 6 is a circuit diagram showing a configuration of a first embodiment of a semiconductor memory device of the present invention.

Configurations of YRED, DAE and MUX of the embodiment shown in FIG. 6 are different from those in the conventional device shown in FIG. 3.

Figure 7:
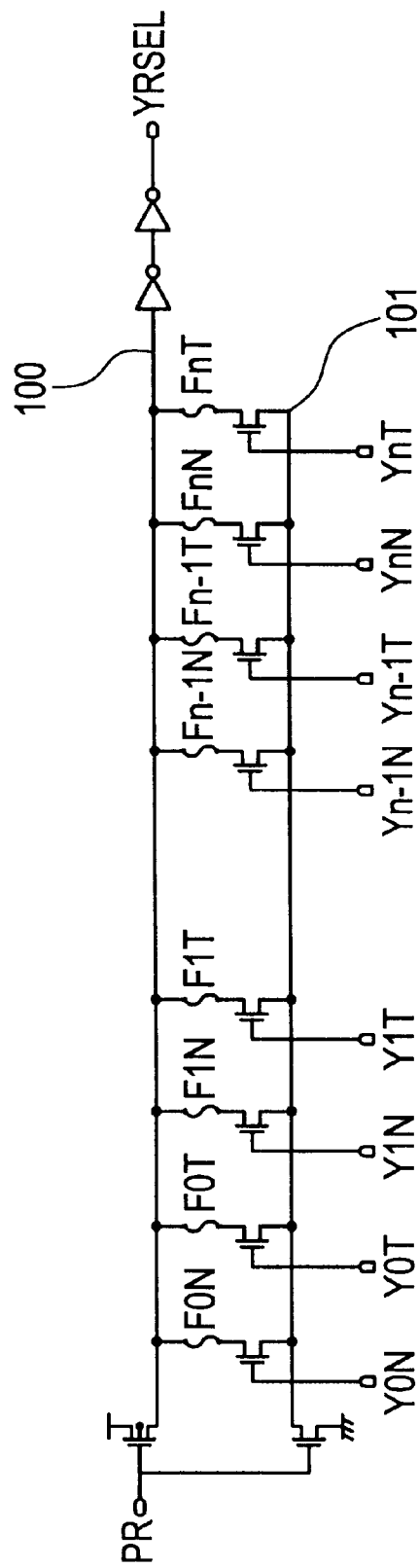
FIG. 7 is a circuit diagram showing a configuration example of a redundancy judging circuit in FIG. 6.

FIG. 7 shows a circuit YRED in FIG. 6. An operation by YRED in FIG. 7 is the same as in YRED in the conventional device. A replacement address is programmed by fuses F0N·F0T to FnN·FnT, and comparison with a row address Y0N·Y0T to YnN·YnT input externally is carried out. Since YnN·YnT are signals to distinguish memory cell array ARRAY0 from ARRAY1, each YRED can replace a defunct cell in both memory cell arrays in the case of a 4-bit configuration. Furthermore, in an 8-bit configuration, by not cutting FnN and FnT, the operation is the same as by the conventional 8-bit configuration product shown in FIG. 2.

Figure 8:
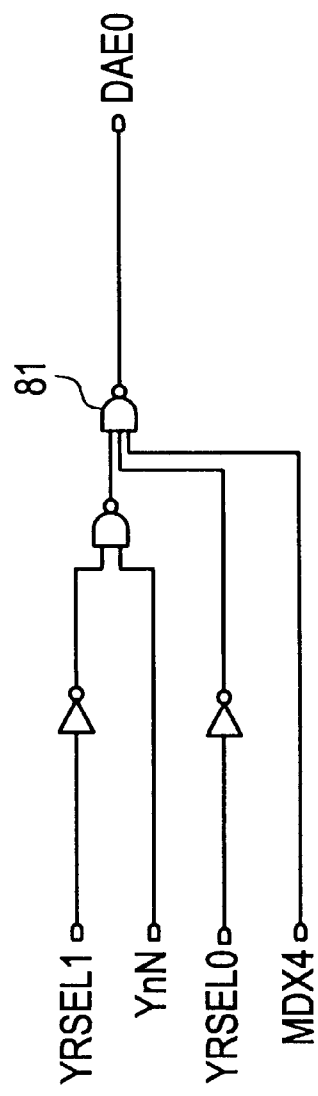
FIG. 8 is a circuit diagram showing an example of a configuration of a data amplifier selecting circuit in a memory cell array shown in FIG. 6.

An operation of data amplifier selecting circuit DAE0 (hereinafter called DAE0) shown in FIG. 8 will be explained next. In the 4-bit configuration (wherein signal MDX4 is HIGH), when a redundant cell in ARRAY0 is replaced, signal YRSEL0 and an output signal from NAND 81 become HIGH, which activates DAE0. When a redundant cell in ARRAY1 is replaced, no redundant cell in ARRAY0 is replaced. Therefore, signal YRSEL0 becomes LOW and signal YRSEL1 becomes HIGH. As a result, the output signal from NAND 81 becomes LOW, and DAE0 is not activated. When no replacement is carried out at all, both YRSEL0 and YRSEL1 are LOW and activation of DAE0 is controlled according to YnN signal. In the case of the 8-bit configuration, signal MDX4 becomes LOW and DAE0 is activated unconditionally. The operation is thus becomes the same as by the conventional 8-bit configuration product shown in FIG. 2. An operation by DAE1 is the same as by DAE0.

Figure 9:
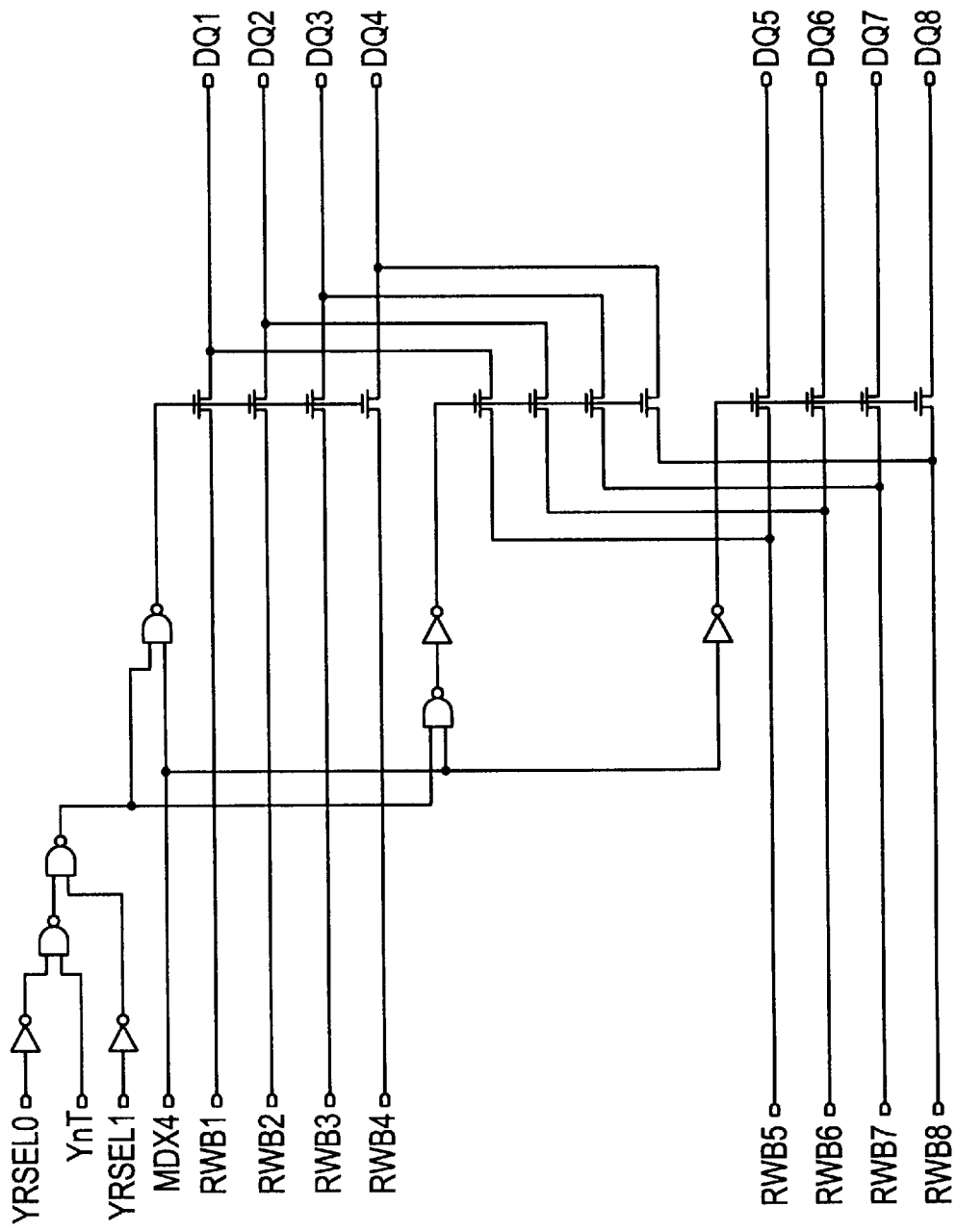
FIG. 9 is a circuit diagram showing an example of a configuration of a multiplexer in FIG. 6.

In FIG. 9, signals YRSEL, YnT and MDX4 are the same as in the conventional example.

Figure 2:
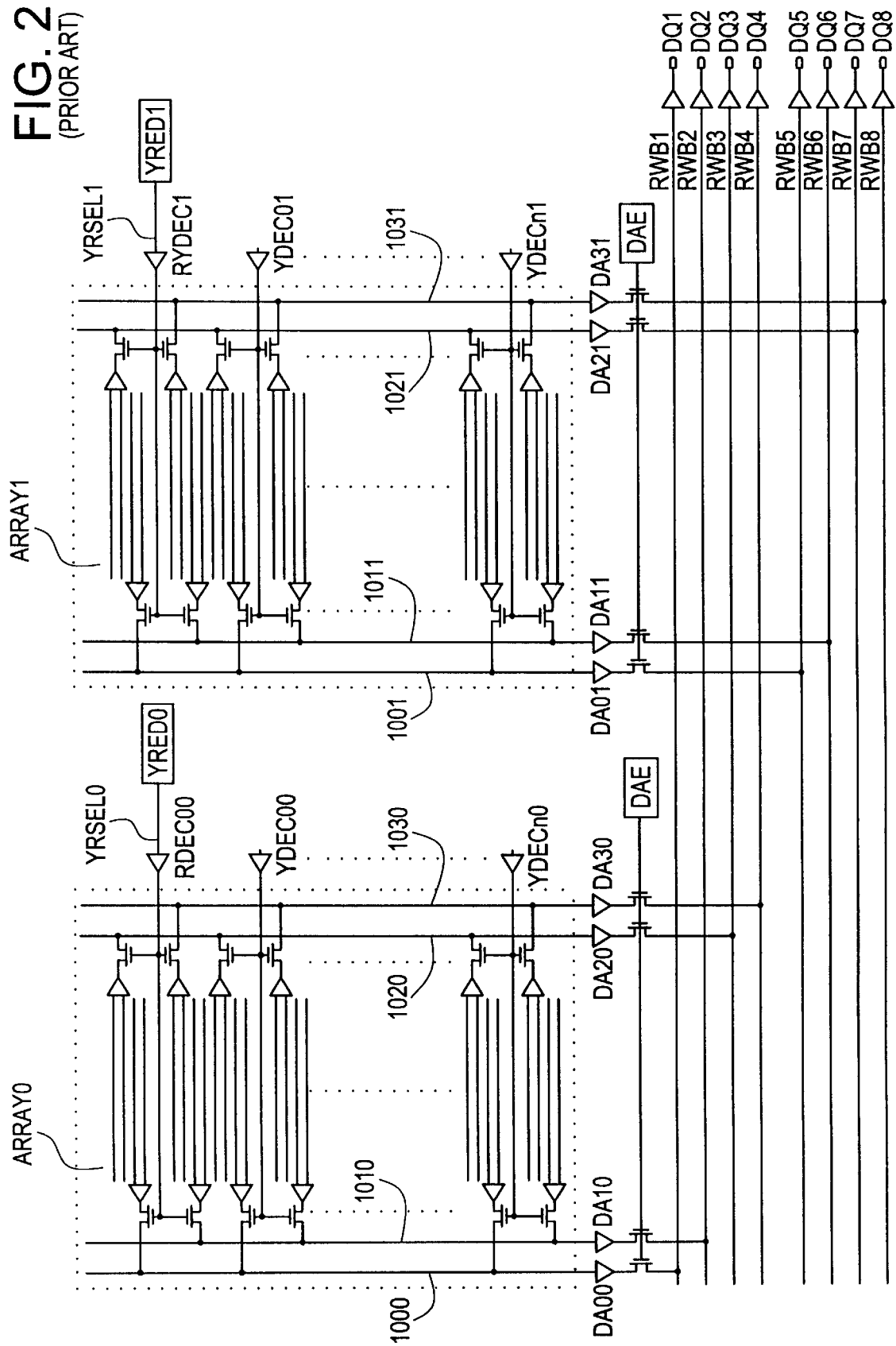
FIG. 2 is a circuit diagram showing a configuration of another conventional semiconductor memory device.

MUX shown in FIG. 9 connects RWB1 to RWB8 and DQ1 to DQ8 one to one in the case of the 8-bit configuration, that is, when signal MDX4 is LOW. As a result, an operation which is the same as that by the 8-bit configuration products shown in FIGS. 2 and 3 is carried out.

Figure 1:
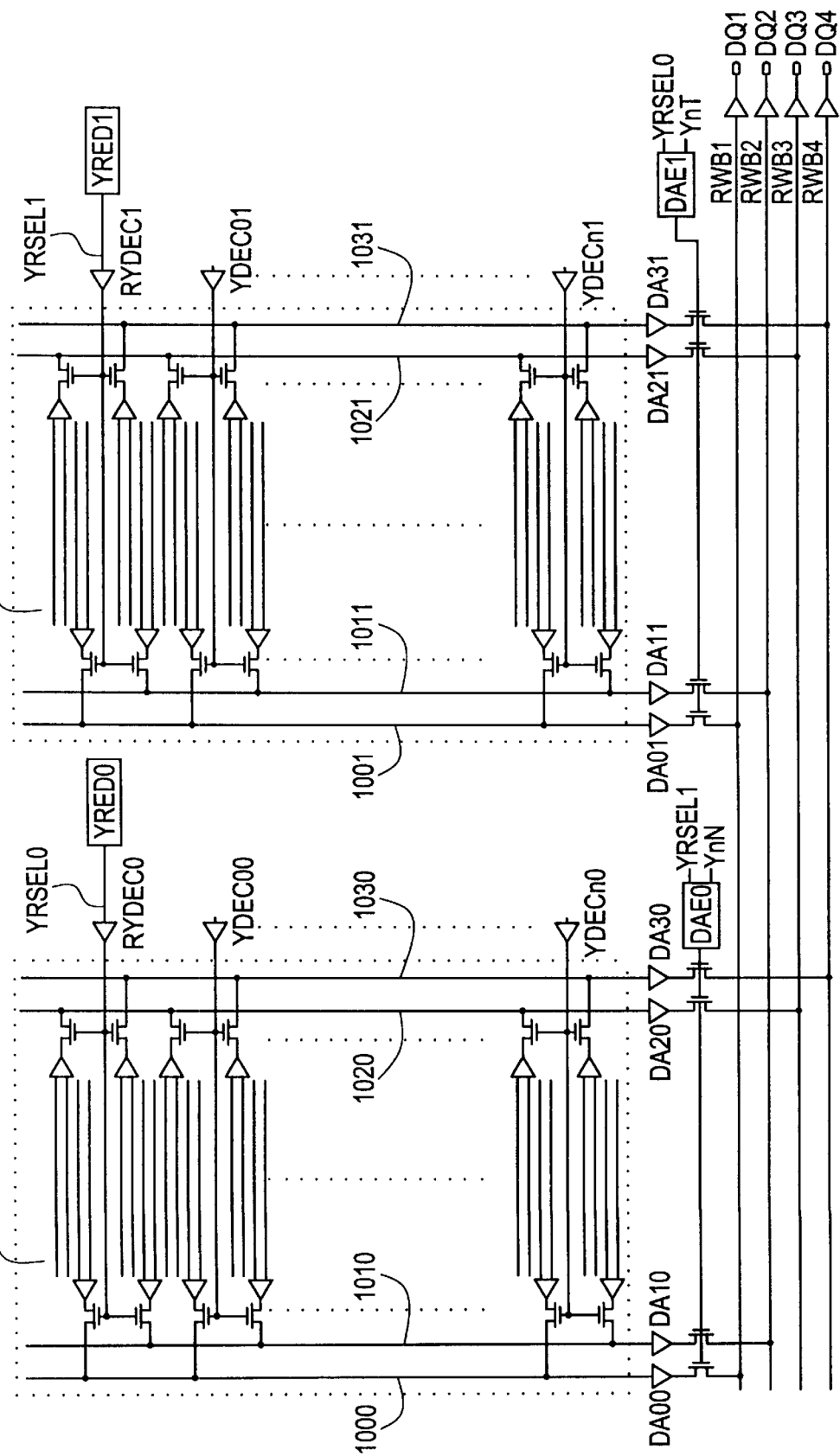
FIG. 1 is a circuit diagram showing a configuration of a conventional semiconductor memory device.

An operation in the case of the 4-bit configuration, that is, when signal MDX4 is HIGH, is as follows. When no redundant cell is selected and all YRSEL signals are LOW, RWB1 to RWB4 and DQ1 to DQ4 are connected one to one if signal YnT is LOW, that is, if ARRAY0 is being activated. If signal YnT is HIGH, that is, if ARRAY1 is being activated, RWB5 to RWB8 and DQ5 to DQ8 are connected one to one. As a result, an operation which is the same as that by the 4-bit configuration products shown in FIGS. 1 and 3 is carried out.

When the redundant cell in ARRAY0 has been selected and signal YRSEL0 is HIGH, RWB1 to RWB4 and DQ1 to DQ4 are connected one to one. When the redundant cell in ARRAY1 has been selected and signal YRSEL1 is HIGH, RWB5 to RWB8 and DQ1 to DQ4 are connected one to one.

As a result, in both cases where the address signal input externally and the replacement address having been stored internally are in agreement to select the redundant cell and where the redundant cell is not selected because of no agreement, data are input and output between data input-output terminals and a selected memory cell array. Therefore, inconvenience which has been explained in the example shown in FIG. 3 will be solved.

In the first embodiment, an example of the semiconductor memory device which comprises two memory cell arrays having four IO lines for each and switches between the 4-bit and 8-bit configurations has been used. However, the number of the memory cell arrays has nothing to do with the nature of the present invention.

In the 8-bit configuration in the first embodiment, each of DQ1 to DQ8 corresponds to an IO line one to one, and all memory cell arrays operate. In a configuration wherein a plurality of IO lines switched by the address signal are assigned to each data input-output terminal and only a portion of memory cell array operates in a maximum input-output data width, it is obvious that a circuit configuration having a function which is the same as that in the above can be implemented without a problem.

[2] Second Embodiment

Figure 10:
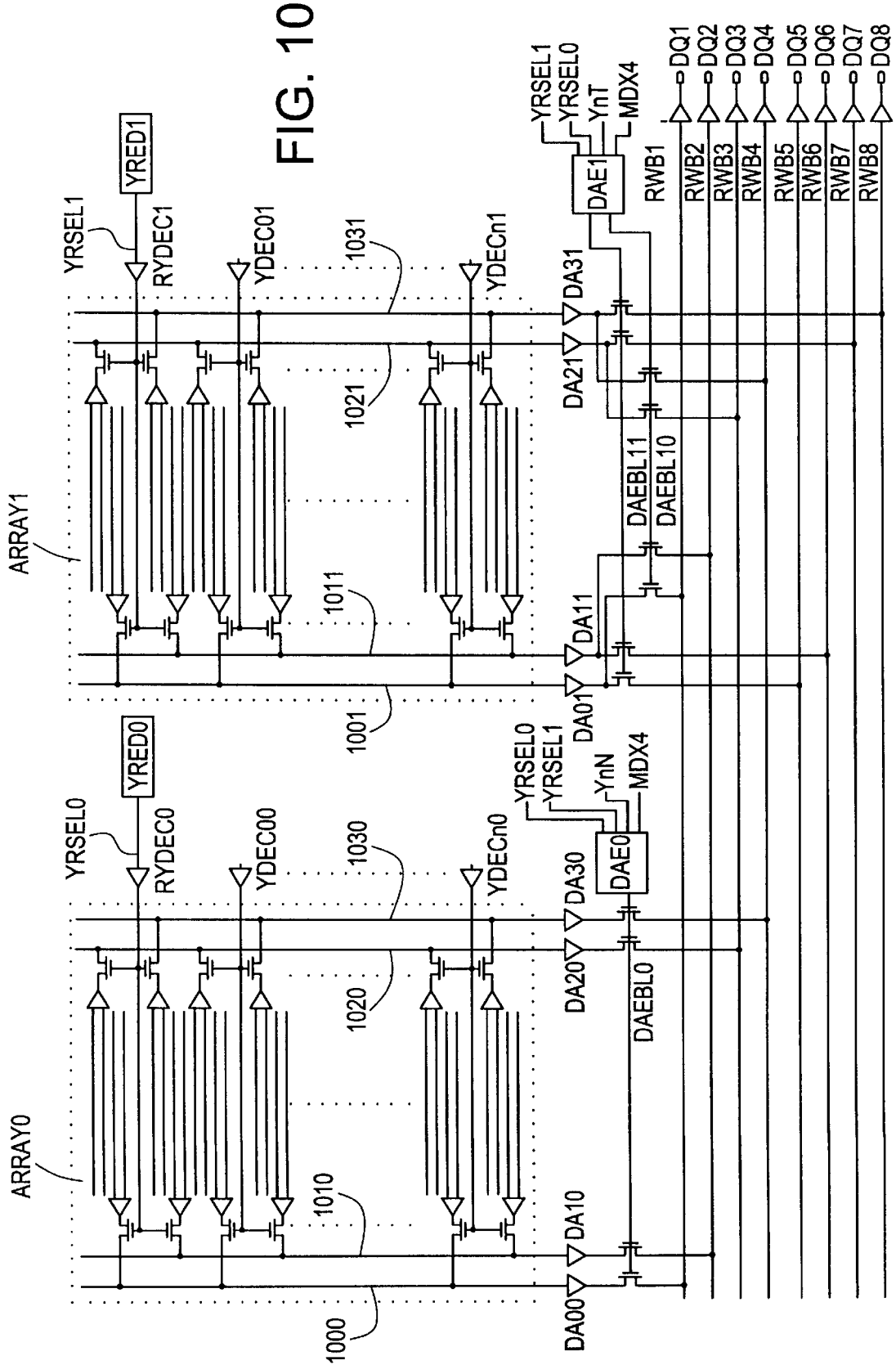
FIG. 10 is a circuit diagram showing a configuration of a second embodiment of a semiconductor memory device of the present invention.

FIG. 10 is a circuit diagram showing a configuration of a second embodiment of a semiconductor memory device of the present invention. In FIG. 10, signals or the like which are not explained specifically are the same as in the conventional examples or in the first embodiment, and explanation of them is omitted here.

In this embodiment, ARRAY1 has the function equivalent to that of MUX, which is the difference from the first embodiment. In other words, in FIG. 10, ARRAY1 comprises gates switching each connection of DA01 to DA31 to either a group of RWB1 to RWB4 or a group of RWB5 to RWB8. These gates are controlled by data amplifier selecting circuit DAE1 whose configuration is shown in FIG. 11b. The configuration of data amplifier selecting circuit DAE0 in ARRAY0 is shown in FIG. 11a.

Figure 11A:
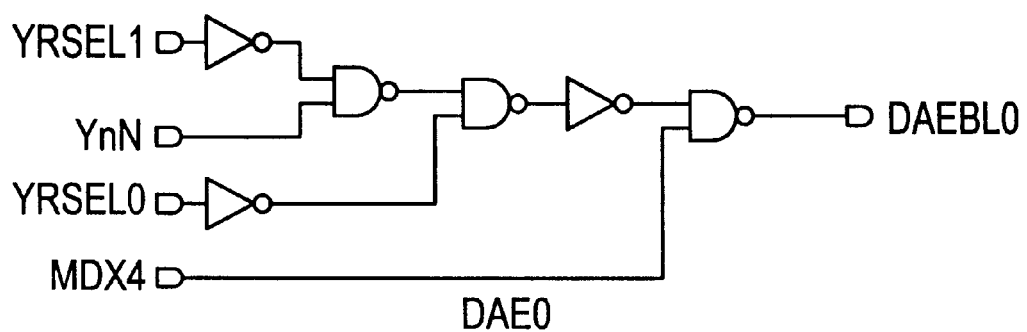
FIG. 11a is a circuit diagram showing an example of a data amplifier selecting circuit DAE0 in FIG. 10.
Figure 11B:
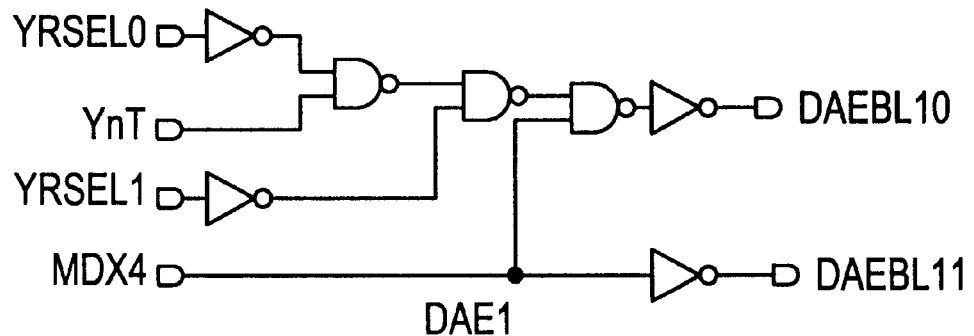
FIG. 11b is a circuit diagram showing an example of a data amplifier selecting circuit DAE1 in FIG. 10.

Now refer to FIGS. 10, 11a, and 11b. In the case of an 8-bit configuration, signal MDX4 is LOW, and signal lines DAEBL01 and DAEBL11 being outputed from DAE0 and DAE1, respectively, are HIGH. Therefore, IO signals of ARRAY0 are connected to DQ1 to DQ4 via DA00 to DA30 and RWB1 to RWB4, respectively. At the same time, IO signals of ARRAY1 are connected to DQ5 to DQ8, respectively, via DA01 to DA31 and RWB5 to RWB8.

In the case of a 4-bit configuration, if no redundant cell has been selected and all YRSEL signals are LOW, only DAEBL0 is activated and IO signals for the redundant cell are connected to DQ1 to DQ4 one to one via DA00 to DA30 and RWB1 to RWB4, respectively, when signal YnN is HIGH and signal YnT is LOW, that is, when ARRAY0 is being activated. When signal YnN is LOW and signal YnT is HIGH, that is, when ARRAY1 is being activated, only DAE1 is activated and output signal line DAEBL10 thereof becomes HIGH. IO signals for the redundant cell are thus connected to DQ1 to DQ4 via DA01 to DA31 and RWB1 to RWB4, respectively.

Furthermore, when the redundant cell in ARRAY0 has been selected and signal YRSEL0 is HIGH, the input and output of the redundant cell are connected to DQ1 to DQ4 via DA00 to DA30 and RWB1 to RWB4, respectively, by activation of DAE0. On the other hand, when the redundant cell in ARRAY1 has been selected and signal YRSEL1 is HIGH, only output signal line DAEBL10 of DAE1 becomes HIGH, and the input and output of the redundant cell are connected to DQ1 to DQ4 via DA01 to DA31 and RWB1 to RWB4, respectively.

In this manner, in the present embodiment, it becomes possible for a redundant cell in either ARRAY0 or ARRAY1 to replace a cell in the other array as in the first embodiment, and the drawback in the conventional example in FIG. 3 can be solved.

The difference between the first embodiment shown in FIG. 6 and the second embodiment shown in FIG. 10 is that MUX is located between RWB1 to RWB8 and DQ1 to DQ8 in the first embodiment, while gates having the function of MUX are installed between RWB1 to RWB8 and DA01 to DA31 wherein the gates are controlled by data amplifier selecting circuit DAE1 in the second sembodiment.

Generally speaking, from the viewpoint of convenience in layout, a memory cell array and a redundancy judging circuit are laid out close to each other, and the memory cell array is placed at a position distant from the input-output terminals. Therefore, a signal line for YRSEL needs to be extended. In other words, in the first embodiment, since switching operations between the memory cell array and data input-output terminals due to bit configuration switch correspond to the input-output terminals one to one, judgment result on whether or not an address signal input externally and the replacement address having been stored are in agreement needs to be transferred to both the memory cell array and the MUX.

On the other hand, in the second embodiment, since each memory cell array comprises the function equivalent to that of MUX which carries out the switching between the memory cell array and the input-output terminals, signal YRSEL does not need to be input to MUX. Therefore, a wire length of signal YRSEL is reduced and a high speed operation and chip size reduction can be realized.

In the first and second embodiments, replacement of a defunct memory cell by a row address has been explained. And further, a semiconductor memory device can also be implemented for replacement of a defunct memory cell by a column address within the scope of the present invention.

According to the present invention, a semiconductor memory device which can switch between 4-bit and 8-bit configurations by using signal MDX4 can be realized by changing a state of an internal signal by changing wire bonding at an assembly process. Furthermore, the device can be realized by changing the internal signal state by a change in a portion of a wiring layer, or by changing the internal signal state by inputting an external signal.

As has been described above, in a semiconductor memory device comprising a plurality of input-output data widths, the present invention improves efficiency of defunct cell compensation means so that a redundant memory cell can be used most efficiently. The present invention can thus provide the semiconductor memory device which can improve the yield and switch input-output data widths easily.

Although certain preferred embodiments of the present invention have been shown and described in detail, it should be understood that various changes and modifications can be made therein without departing from the scope of the appended claims.

What is claimed is:

1. A semiconductor memory device comprising:

at least two memory cell arrays comprising at least one redundant memory cell and a plurality of memory cells for each of the memory cell arrays;

comparison means which compares an external address signal input externally with an internal address, outputs a detection signal showing whether or not the both addresses agree, and activates a corresponding redundant memory cell when the addresses agree;

input-output data width changing means which selects an input-output data width of the memory cell array; and selecting means which activates or inactivates corresponding memory cell array upon selection of the input-output data width by the input-output data width changing means and upon output of the detection signal from the comparison means; wherein the number of digits of the external address signal to be compared by the comparison means is changed when the input-output data width is changed by the input-output data width changing means.

2. A semiconductor memory device as claimed in claim 1 wherein the memory cell array comprises local data input-output lines shared by each memory cell and the redundant memory cell, and further comprises:

global data input-output lines selectively connected to the local data input-output lines and data inpu-output terminals connected to the global data input-output lines.

3. A semiconductor memory device as claimed in claim 2 wherein at least one of the memory cell arrays comprises switching means for switching connections between the memory cell array and the data input-output terminals in conjunction with a data width set by the input-output data width changing means.

4. A semiconductor memory device as claimed in claim 3 wherein the input-output data width changing means is realized by changing states of internal signals by changing wire bonding in an assembly process.

5. A semiconductor memory device as claimed in claim 3 wherein the input-output data width changing means is realized by changing states of internal signals by changing a portion of a wiring layer.

6. A semiconductor memory device as claimed in claim 3 wherein the input-output data width changing means is realized by changing states of internal signals by inputting an external signal.

7. A semiconductor memory device as claimed in claim 3 wherein the switching means is inserted between the global data input-output lines and the input-output terminals.

8. A semiconductor memory device as claimed in claim 3 wherein the switching means is inserted between the local data input-output lines and the global data input-output lines.

* * * * *